United States Patent [19]

Senuma et al.

[11] Patent Number: 5,124,761
[45] Date of Patent: Jun. 23, 1992

[54] SEMICONDUCTOR APPARATUS

[75] Inventors: Toshitaka Senuma; Futao Yamaguchi, both of Tokyo, Japan

[73] Assignee: Sony Corporation, Tokyo, Japan

[21] Appl. No.: 759,033

[22] PCT Filed: Jan. 20, 1989

[86] PCT No.: PCT/JP89/00050

§ 371 Date: Sep. 22, 1989

§ 102(e) Date: Sep. 22, 1989

[87] PCT Pub. No.: WO89/06862

PCT Pub. Date: Jul. 27, 1989

Related U.S. Application Data

[63] Continuation of Ser. No. 423,425, filed as PCT/JP89/00050, Jan. 20, 1989, abandoned.

[30] Foreign Application Priority Data

Jan. 22, 1988 [JP] Japan .................. 63-12107
May 30, 1988 [JP] Japan .................. 63-132103

[51] Int. Cl.⁵ .............................. H01L 29/92
[52] U.S. Cl. .......................... 357/14; 357/13; 357/12; 307/303
[58] Field of Search ............ 357/12, 13, 14, 42; 307/303, 491, 543

[56] References Cited

U.S. PATENT DOCUMENTS 4,151,610  4/1979  Suzuki et al. .................. 357/14
4,214,252  7/1980  Goerter ........................ 357/14
4,672,403  6/1987  Jennings ....................... 357/14

FOREIGN PATENT DOCUMENTS 48-83787   11/1973  Japan .
55-43812   3/1980   Japan .
60-170964  9/1985   Japan .................. 357/14
61-24824   6/1986   Japan .
62-92458   4/1987   Japan .................. 357/14
62-92459   4/1987   Japan .................. 357/14
62-142342  6/1987   Japan .................. 357/14
63-155680  6/1988   Japan .................. 357/14

Primary Examiner—Jerome Jackson, Jr.
Assistant Examiner—Hung Xuan Dang
Attorney, Agent, or Firm—Hill, Van Santen, Steadman & Simpson

[57] ABSTRACT

A semiconductor apparatus of the present invention comprises, as, for example, shown in FIG. 5, a semiconductor region (32) of first conductivity type formed on a semiconductor substrate (31), and a semiconductor region (34) of second conductivity type formed in the semiconductor region (32) of first conductivity type, in which a first electrode (38a) is formed on the semiconductor region (34) of second conductivity type to form a capacitance through a dielectric layer (37), a second electrode (38c) connected to the semiconductor region (32) of first conductivity type is provided and a third electrode (38b) connected to the semiconductor region (34) of second conductivity type is provided, whereby easiness (capacitor) can be prevented from being affected by a junction capacitance between semiconductor layers of different conductivity types.

4 Claims, 5 Drawing Sheets

SEMICONDUCTOR APPARATUS

This is a continuation of application Ser. No. 423,425, filed as PCT/JP89/00050, Jan. 20, 1989, now abandoned.

TECHNICAL FIELD

The present invention relates to a semiconductor apparatus which can eliminate an influence exerted by a parasitic capacitance, and which can alleviate restrictions on the driving condition.

BACKGROUND ART

In a prior-art home VTR, in a recording system and a reproducing system there is commonly provided a so-called ACC circuit in which an amplitude of a color burst signal is detected to control a gain of a chrominance signal amplifier thereby maintaining an amplitude of the chrominance signal constant FIG. 4 shows a previously-proposed semiconductor apparatus used in this ACC circuit.

The VTR and the ACC circuit according to the prior art will be described with reference to FIGS. 1 and 2.

FIG. 1 shows an example of an arrangement of a reproducing system of a prior-art VTR.

Referring to FIG. 1, reproduced outputs from a pair of rotary magnetic heads 1A and 1B are commonly supplied through a head change-over switch 2 and an amplifier 3 to a high-pass filter 4 and a low-pass filter 5 from which there are separated an FM luminance signal $Y_{FM}$ and a down converted chrominance signal $C_L$.

The FM luminance signal $Y_{FM}$ is supplied to a luminance signal processing circuit 7 which includes an FM-demodulator 6, and a reproduced luminance signal Y therefrom is supplied to an adder 8.

The down-converted chrominance signal $C_L$ is supplied through a chrominance signal amplifier 11 to a frequency converting circuit 12, in which it is converted to an original carrier chrominance signal C in response to an output from a local oscillator not shown. The reproduced carrier chrominance signal C from the frequency converting circuit 12 is supplied to the adder 8 through a bandpass filter 13 whose center frequency is a color subcarrier frequency fsc, and the adder 8 derives a color video signal.

A burst gate circuit 14 is supplied with the output of the bandpass filter 13, and the reproduced color burst signal extracted thereby is supplied to an ACC detector 15. The detected output therefrom is supplied through an ACC circuit 20 to the chrominance signal amplifier 11 of which the gain is therefore ACC-controlled.

In order to protect the chrominance signal from a flicker caused by an output level difference when the characteristics of the rotary magnetic heads 1A and 1B are not equal, the ACC circuit 20 employs capacitors 21A and 21B of the same capacitance to form time constant circuits having time constants different in field. The time constant circuits are changed-over by the switching pulse from a pulse generator 9 in synchronism with the switching operation of the rotary heads 1A and 1B.

As shown in FIG. 2, in the prior-art ACC circuit 20, the capacitors 21A and 21B are respectively connected to output terminals of differential amplifiers (comparing circuits) 22A and 22B. The differential amplifiers 22A and 22B are alternately supplied at non-inverting input terminals thereof with a detected output $V_{15}$ applied to an input terminal 20i of the ACC circuit 20 from the ACC detector 15 through a change-over switch 23i at every field, and they are also commonly supplied at their inverting input terminals with a reference voltage Vr of a reference voltage source 24. The differential amplifiers 22A and 22B respectively supply the corresponding capacitors 21A and 21B with output currents corresponding to differences between the ACC detected output voltage $V_{15}$ and the reference voltage Vr. The terminal voltages across the capacitors 21A and 21B are alternately supplied through buffer amplifiers (buffers) 25A and 25B and a change-over switch 23o to an output terminal 20o at every field. The switches 23i and 23o are changed in position at every field in response to the switching pulse from a control terminal 20c in a ganged-fashion.

In the conventional ACC circuit shown in FIG. 2, the two signal systems respectively including the differential amplifiers 22A and 22B are switched by the switches 23i and 23o, which provides a large-sized circuit scale and a complicated arrangement. Further, even when they are formed as an integrated circuit on the same semiconductor substrate, there is then a fear that an offset will occur between the characteristics of the two differential amplifiers.

To solve the above-noted problem, the present applicant has previously proposed, as disclosed in Japanese Utility Model Application No. 61-200570, an Acc circuit in which an output of a single comparing circuit is held by a plurality of capacitors which are switched at every field in synchronism with the change-over of rotary heads.

The previously-proposed ACC circuit will be explained with reference to FIG. 3.

FIG. 3 shows an example of an arrangement of the previously-proposed ACC circuit. In FIG. 3, like parts corresponding to those of FIG. 2 are marked with the same references.

In FIG. 3, reference numeral 20S generally designates an ACC circuit which mainly comprises a single differential amplifier 22, a pair of capacitors 21A and 21B whose one electrodes are commonly connected to the output terminal of the differential amplifier and a change-over switch 26 which alternately grounds the other electrodes of the two capacitors 21A and 21B at every field.

The previously-proposed ACC circuit 20S is operated as follows.

When one rotary head 1A (see FIG. 1) scans a magnetic tape, the change-over switch 26 is connected as shown by a dashed line. The ACC detected output from the input terminal 20i and the reference voltage Vr are level-compared by the differential amplifier 22, and a current corresponding to the level difference is supplied from the differential amplifier 22 to one capacitor 21A. Thus, its terminal voltage becomes a value corresponding to the difference between the burst signal level and the reference voltage Vr.

When the other rotary head 1B scans the magnetic tape, the switch 26 is connected as shown by a solid line, whereby the other capacitor 21B is charged up similarly as described above.

The terminal voltages across the capacitors 21A and 21B are delivered through, for example, an emitter-follower-type buffer 25 to the output terminal 20o and then supplied to the amplifier 11 (see FIG. 1). The gain of the amplifier 11 is therefore controlled such that the level of the color burst signal coincides with the reference level According to the previously-proposed ACC circuit as described above, only the single differential amplifier is required so that the circuit scale becomes small, the arrangement is simplified and that the offset is prevented from being caused between the differential amplifiers.

When the above-mentioned, previously-proposed ACC circuit is formed on a semiconductor circuit (formed as an IC) including the capacitors 21A and 21B, it is unavoidable that the capacitors 21A and 21B are accompanied with parasitic capacitances 27A and 27B a shown by dashed lines in FIG. 3.

This is because the capacitor mounted on the semiconductor integrated circuit is generally formed as a so-called MIS (metal insulation substrate) capacitance as shown in FIG. 4.

In FIG. 4, reference numeral 31 designates a P-type silicon substrate in which an N-type epitaxial layer 32 is formed on its surface portion as an island-shape. Further, an $n^-$-type diffusion layer 33 is selectively formed on the surface portion of the N-type epitaxial layer 32 by the emitter diffusion-process. Through an oxide film 35 for protecting the surface of the semiconductor, large and small windows 36a nd 36b are formed on the diffusion layer 33.

A dielectric layer 37 is, for example, 500 Å in thickness and is made of nitride silicon $Si_3N_4$. This dielectric layer is deposited on the $n^-$-type diffusion layer 33 within the large window 36a of the oxide film 35. An Al electrode 38a is deposited on the dielectric layer 37 and an Al electrode 38b is deposited on the diffusion layer 33 within the small window 36b, whereby the diffusion layer 33 and the Al electrode 38a are opposed to each other through the dielectric layer 37, thus forming a capacitor having a capacitance of, for example, 100 pF.

A junction capacitance $C_j$ exists between the n-type island 32 communicated to the $n^-$-type diffusion layer 33 and the p-type silicon substrate 31 of earth potential as is conventional, and this junction capacitance $C_j$ becomes the parasitic capacitance of the capacitor which is constructed by the MIS technique. The value of the parasitic capacitance depends on constituents of the p-type silicon substrate 31 and the n-type island 32, and is generally about 10% of the capacitance of the capacitor constructed by the MIS technique.

The p-type substrate 31 and the n-type island 32 have a characteristic of a diode $D_j$ as well as the above-noted junction capacitance $C_j$.

If the previously-proposed ACC circuit shown in FIG. 3 is formed as an IC, the parasitic capacitances 27A and 27B are produced by the above-noted junction capacitance so that the independence of the two capacitors 21A and 21B will no be kept even if the switch 26 is changed over.

When the change-over switch 26 is connected as shown by the solid line in FIG. 3, to the other capacitor 21B grounded thereby, a serially-mixed capacitance of one capacitor 21A and the parasitic capacitance 27A thereof is connected in parallel.

In like a manner, when the switch 26 is connected as shown by the dashed line, to one capacitor 21A, a serially-mixed capacitance of the other capacitor 21B and the parasitic capacitance 27B thereby is connected in Assuming that the capacitance values of the parasitic capacitances 27A and 27B are, for example, 10% of the capacitance values of the corresponding capacitors 21A and 21B respectively as described hereinabove, then the values of the serially-mixed capacitances reach, for example, values a little larger than 9 % of the capacitance values of the capacitors 21A and 21B.

Thus, when the previously-proposed ACC circuit 20S is formed as an IC, the independence of each of the capacitors 21A and 21B is damaged so that a cross-talk occurs between the ACC control signals of each field held in the capacitors 21A and 21B. As a result, the flicker of the chrominance signal can not be eliminated completely.

If the output current from the differential amplifier 22 is supplied through the change-over switch to first electrodes of the pair of capacitors and the second electrodes of the two capacitors are grounded unlike FIG. 3, the problem of the parasitic capacitances will be solved. There are then presented problems such as the occurrence of a leak current of a switching element used to switch the current, a decrease of D.C. voltage availability (dynamic range) and the like.

In the semiconductor apparatus of FIG. 4, the dielectric layer 37 is thin in thickness and is small in electrostatic strength, whereby the electrode 38a is interconnected and the electrode 38b is led out to the outside as an MIS capacitance terminal. When the potential of the electrode 38b is lowered to the winding region, the junction diode $D_j$ is turned ON, permitting an excess current to flow from the substrate 31 to the n-type island 32. There is then presented a problem that it becomes impossible to use the semiconductor apparatus.

DISCLOSURE OF INVENTION

In view of the above-mentioned aspect, an object of the present invention is to provide a semiconductor apparatus which can reduce restrictions on driving conditions, and which can eliminate an influence of parasitic capacitance exerted on an MIS capacitance.

A semiconductor apparatus of the present invention comprises a semiconductor region 32 of a second conductivity type formed on a semiconductor substrate 31 of a first conductivity type and a semiconductor area 34 of a first conductivity type formed in the semiconductor region of the second conductivity type, wherein a first Al electrode 38a is formed on the semiconductor area of the first conductivity type through a dielectric layer 37 to form a capacitance and first and second deriving electrodes 38b and 38c are formed on the semiconductor regions of the first and second conductivity types.

In a semiconductor apparatus of the present invention, a semiconductor region 34 of first conductivity type is formed on a semiconductor substrate 31 of first conductivity type through a semiconductor region 32 of second conductivity type, a conductive layer 38a is opposed through a dielectric layer 37 to the semiconductor layer of first conductivity type to form a capacitor 21, one of electrodes A and B of this capacitor is connected to an input terminal of a buffer amplifier 25 mounted on the semiconductor substrate, and an output terminal of the buffer amplifier and a deriving electrode C led out from the semiconductor region of second conductivity type are connected. According to the present invention as described above, the capacitor 21A or 21B formed according to the MIS technique is floated so that it can be prevented from being affected by a Junction capacitance between the semiconductor layers of different conductivity types. Further, the potential of the deriving electrode is expanded in range.

BEST MODE FOR CARRYING OUT THE INVENTION

An embodiment of a semiconductor apparatus according to the present invention will hereinafter be described with reference to FIG. 5.

Figure 4:
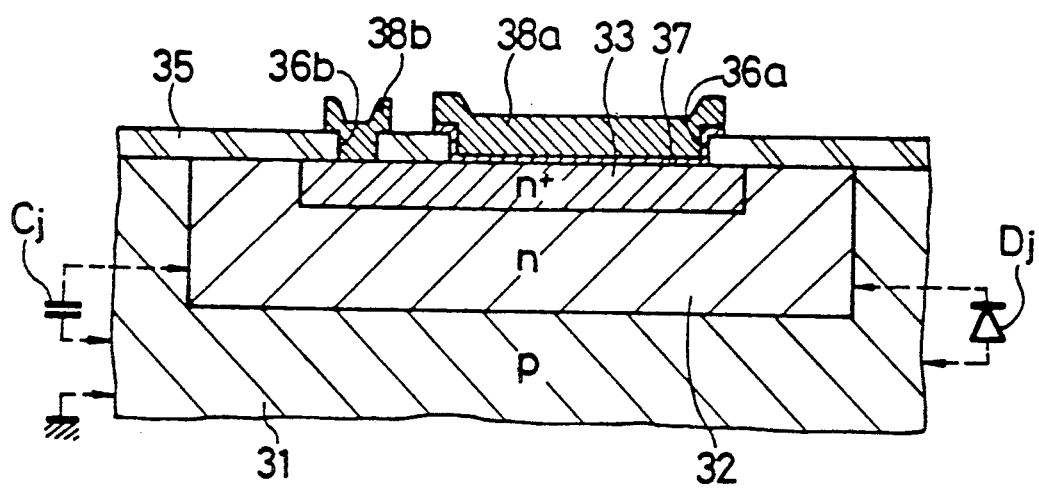
FIG. 4 is a diagrammatic view of a section showing an arrangement of an example according to the prior art.
Figure 5:
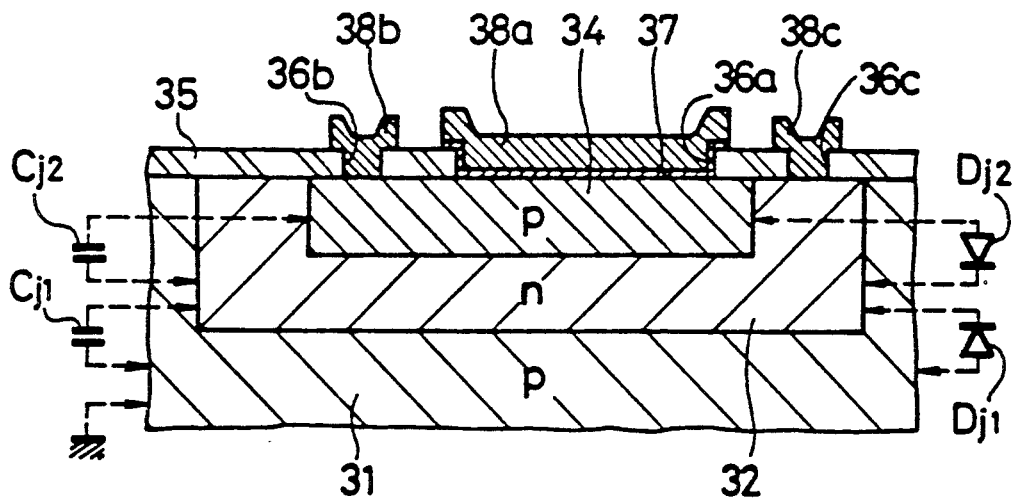
FIG. 5 is a diagrammatic view of a section showing an arrangement of an embodiment of a semiconductor apparatus according to the present invention.

FIG. 5 shows an arrangement of an embodiment of the present invention. In FIG. 5, like parts corresponding to those of FIG. 4 are marked with the same references and therefore an overlapping explanation will not be made.

As shown in FIG. 5, a p-type diffusion layer 34 is selectively formed on the surface portion of the island-shaped n-type epitaxial layer 32 by a base-diffusion process. The large window 36a and the small window 36b are formed through the protecting film 35 on the p-type diffusion layer 34, and a second small window 36c is formed through the protecting film 35 on the surface of the n-type island 32. Within this small window 36c, an Al electrode 38c is deposited on the n-type island 32.

Similarly as described hereinbefore, a junction capacitance $C_{j1}$ and a diode $D_{j1}$ are formed between the p-type substrate 31 and the n-type island 32, and a junction capacitance $C_{j2}$ and a diode $D_{j2}$ are formed between the n-type island 32 and the p-type diffusion layer 34. Other arrangements are similar to those of FIG. 4.

With the above-mentioned arrangement, if a negative potential is supplied to the p-type diffusion layer 34 through the Al electrode 38b, then the diode $D_{j2}$ formed between the p-type diffusion layer and the n-type island 32 is reversely biased to prevent the potential of the n-type island 32 from being lowered to the negative region. Thus, the diode $D_{j1}$ formed between the island 32 and the p-type substrate 31 is turned ON, thus avoiding the excess current from flowing.

As described above, according to this embodiment, the negative potential may be supplied to the p-type diffusion layer 34 and a range of available voltage can be extended compared with the example according to the prior art.

How to eliminate the influence by the junction capacitance will be explained below.

A semiconductor apparatus according to other embodiment, which is applied to an ACC circuit of a VTR, will be described next with reference to FIG. 6.

Figure 1:
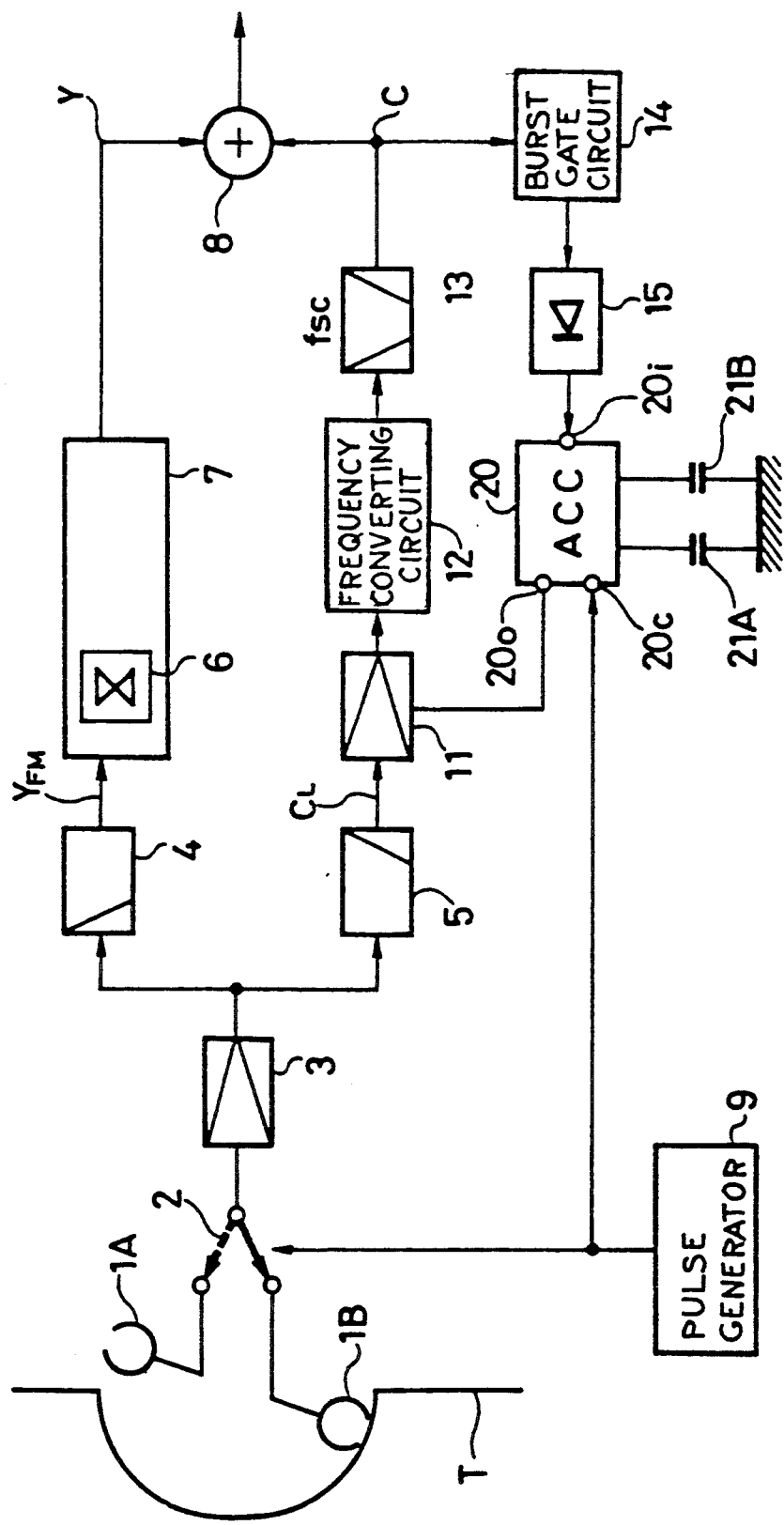
FIGS. 1 and 2 are a block diagram and a connection diagram to which reference will be made in explaining the present invention.
Figure 2:
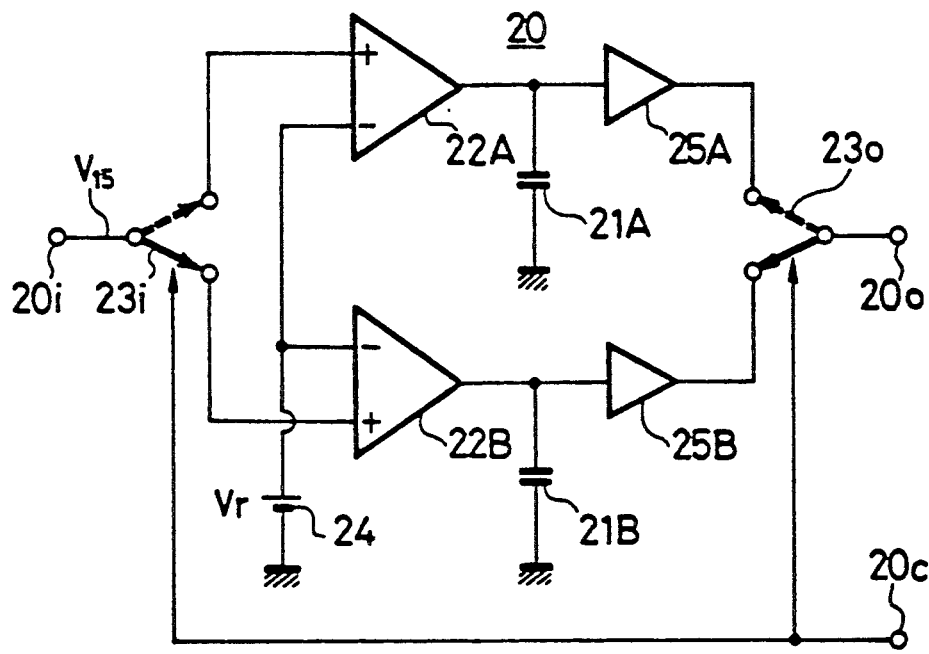
Figure 3:
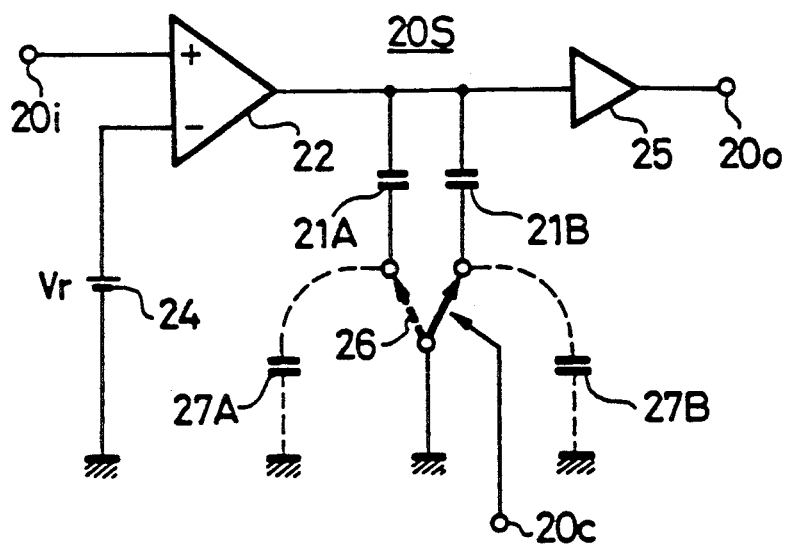
FIG. 3 is a connection diagram showing an example of an arrangement of a previously-proposed ACC circuit.
Figure 6:
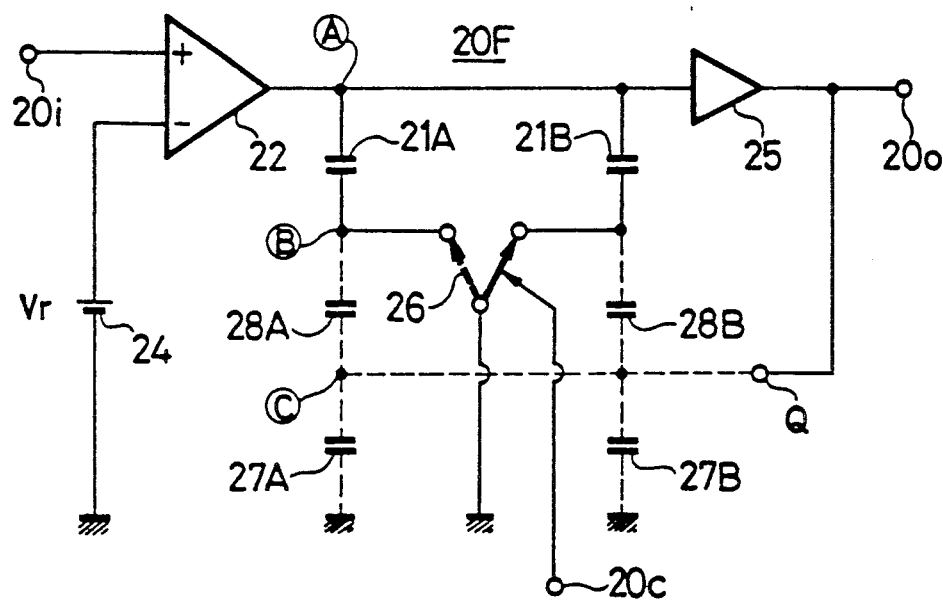
FIGS. 6 and 7 are connection diagrams showing arrangements of other embodiments in which the present invention is applied to the ACC circuit, respectively

FIG. 6 shows an arrangement of another embodiment of the present invention which is applied to the ACC circuit. In FIG. 6, like parts corresponding to those of FIG. 3 are marked with the same references and an overlapping explanation will therefore not be made.

In FIG. 6, reference numeral 20F generally designates an ACC circuit, in which third and fourth parasitic capacitances 28A and 28B are respectively connected in series between the capacitors 21A, 21B and the corresponding parasitic capacitances 27A, 27B. A junction B between one capacitor 21A and the parasitic capacitance 28A is connected to one fixed contact of the switch 26, while a junction between the other capacitor 21B and the parasitic capacitance 28B is connected to the other fixed contact of the switch 26. A junction C between the first and third parasitic capacitances 27A and 28A and a junction between the second and fourth parasitic capacitances 27B and 28B are both connected to an intermediate terminal Q, and this terminal Q and the output terminal of the buffer 25 are connected to each other.

The third and fourth parasitic capacitances 28A and 28B are formed as shown in FIG. 5. The terminal A of the capacitor 21A and the junctions B and C correspond to the A( electrodes 38a, 38b and 38c of FIG. 5, respectively. Other arrangements are similar to those of FIG. 3.

The operation of the embodiment of FIG. 6 is as follows.

When the change-over switch 26 is connected as, for example, shown by a solid line, the other capacitor 21B is directly grounded. One capacitor 21A is grounded via the first and third parasitic capacitances 27A and 28A. In this embodiment, the output terminal of the buffer 25 is connected through the intermediate terminal Q to the junction C of the two parasitic capacitances 27A and 28A so that the first parasitic capacitance 27A is connected in parallel to the low output impedance of the buffer 25, thus the first parasitic capacitance being substantially short-circuited.

Further, since the potential at the output terminal of the buffer 25 is changed in the same way as the potential at the input terminal thereof is changed, a potential difference between the input and output terminals of the buffer 25 becomes constant. In this embodiment, for example, one capacitor 21A and the third parasitic capacitance 28A are serially connected between the input and output terminals of the buffer 25 so that, even if they are connected to the output terminal of the differential amplifier 22, the voltage across the serially-mixed capacitance becomes constant.

In the example of the previously-proposed semiconductor apparatus shown in FIG. 3, since the voltage across the serially mixed capacitances of, for example, one capacitor 21A and the parasitic capacitance 27A is changed together with the voltage across the other capacitor 21B, the independence of the two capacitors 21A and 21B is not damaged.

In the embodiment shown in FIG. 6, however, the voltage across the serially-mixed capacitance of, for example, one capacitor 21A and the third parasitic capacitance 28A becomes constant as described above so that the independence of the two capacitors 21A and 21B is not damaged. Thus, a cross-talk component can be prevented from being produced between the ACC control signals of every field, and hence, a flicker of the chrominance signal can be eliminated completely.

A semiconductor apparatus according to a further embodiment of the present invention, which is applied to the ACC circuit of a VTR, will be explained next with reference to FIG. 7.

Figure 7:
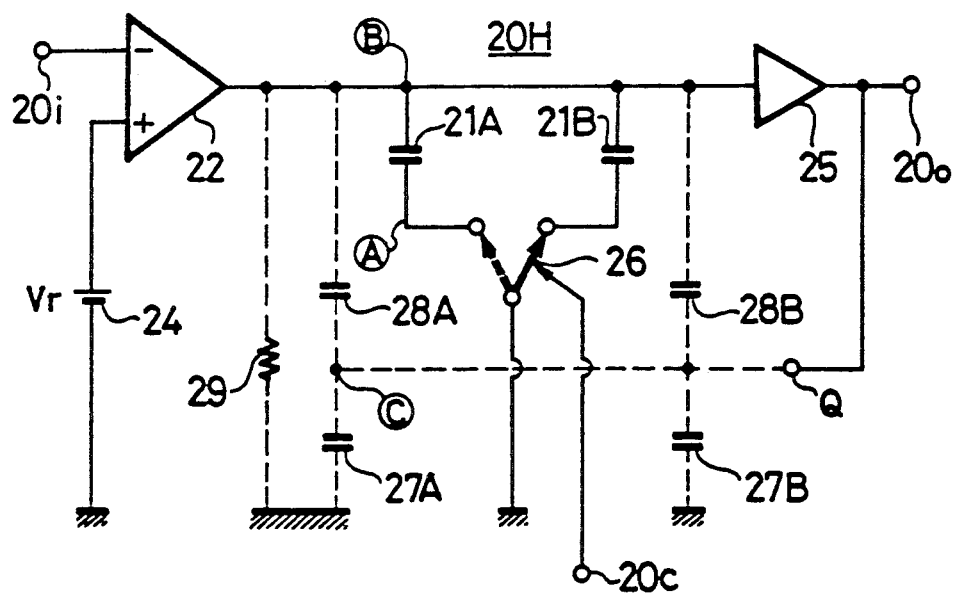

In FIG. 7, like parts corresponding to those of FIGS. 6 and 3 are marked with the same references and an overlapping explanation will not be made.

In FIG. 7, reference numeral 20H represents generally an ACC circuit, in which similarly to the embodiment of FIG. 6, the third and fourth parasitic capacitances 28A and 28B are serially connected between the capacitors 21A, 21B and the corresponding parasitic capacitances 27A, 27B, respectively. In this embodiment, however, the connections of the terminals of the capacitors 21A and 21B are inverted.

That is, one electrodes ( A ) of the capacitors 21A and 21B are respectively connected to the fixed contacts of the change-over switch 26, and the junction B between one capacitor 21A and the parasitic capacitance 28A and the junction between the other capacitor 21B and the parasitic capacitance 28B are both connected to the output terminal of the differential amplifier 22. As described hereinbefore, the parasitic capacitances, for example, 27A and 28A correspond to the junction capacitances $C_{j1}$ and $C_{j2}$ of FIG. 5, and which are accompanied with leak currents on the respective junction surfaces of the p-type substrate 31, the n-type island 32 and the p-type diffusion layer 34. Reference numeral 29 designates a leak resistor corresponding to the leak currents of the parasitic capacitances 27A, 28A and 27B, 28B. Other arrangements are similar to those of FIG. 6.

In the embodiment of FIG. 7, the leak resistor 29 is connected to the output terminal of the low impedance of the differential amplifier 22, so that the leak current corresponding to the leak resistor is cancelled out by the output current of the amplifier 22.

Since one terminal A of the capacitor 21A, or electrode 38a is insulated from the p-type diffusion layer 34 by the dielectric layer 37, the leak current is very small, and the influence of leak current in the holding period is also very small.

When the current is negatively fed back from the buffer 25 to the differential amplifier 22, the influence of the leak current can be substantially neglected.

While in the above-mentioned embodiment the present invention is applied to the ACC circuit of the VTR, the present invention is not limited to the above-noted embodiment and can be made suitable for a wide variety of circuits such as a time-division hold circuit or the like.

A further embodiment of the semiconductor apparatus according to the present invention will be described with reference to FIG. 8.

Figure 8:
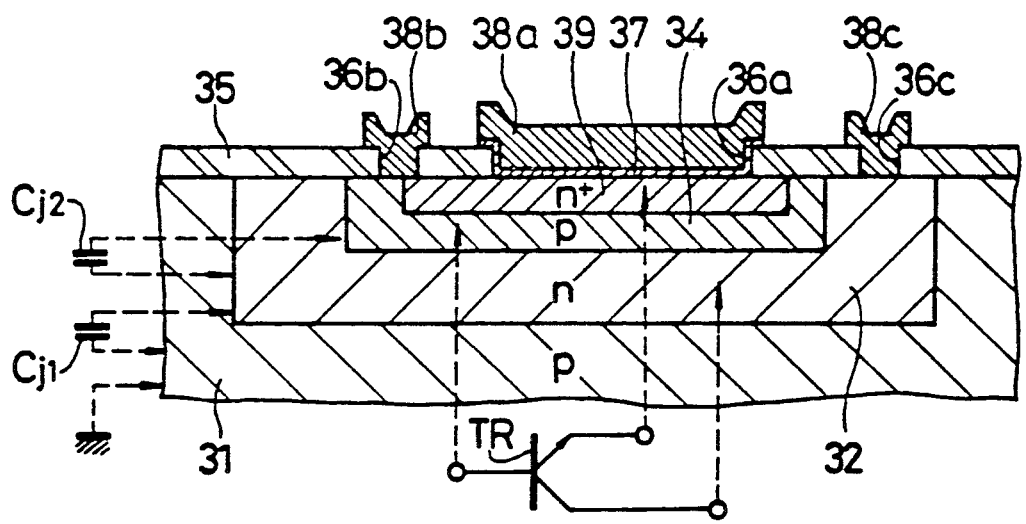
FIG. 8 is a diagrammatic view of a section showing an arrangement of a further embodiment of the present invention.

In FIG. 8, like parts corresponding to those of FIGS. 4 and 5 are marked with the same references and an overlapping explanation will not be made.

In FIG. 8, reference numeral 39 designates an n+-type diffusion layer of low resistance value which is selectively formed on the surface portion of the p-type diffusion layer 34 by the emitter-diffusion process. The location of the n+-type diffusion layer 39 is determined such that its one border with the p-type diffusion layer 34 in the lateral direction (face direction) is opposed to the small window 36b of the protecting film 35. Other arrangements are similar to those of FIG. 5.

In the arrangement of FIG. 8, the n+-type diffusion layer 39 is contacted with the dielectric layer 37 to form the other electrode and the lead wire of the capacitor by the MIS technique together with the p-type diffusion layer 34. Since the diffusion layer 39 is low in resistance value as described above, the deriving resistance of the MIS capacitor is reduced, the capacitor is reduced in loss and the frequency characteristic can be improved.

Base and emitter of an npn-system transistor TR formed by the n-type island 32, the p-type diffusion layer 34 and the n+-type diffusion layer 39 are short-circuited by the Al electrode 38b.

Thus, even when the negative potential is supplied to the n-type island 32 through the Al electrode 38b, the transistor TR is in its OFF state so that an excess current can be prevented from being flowed to the substrate 31.

While in the above-mentioned embodiment the present invention is applied to a bipolar-type semiconductor, the capacitance of the similar arrangement can be utilized in the MOS-type semiconductor.

As set forth above in detail, according to the present invention, since the semiconductor layer of second conductivity type is interposed between the semiconductor layer of first conductivity type opposing the metal layer through the dielectric layer to form the capacitor and the semiconductor substrate, the range in which the potential is supplied to the deriving electrode of the capacitor is extended. Also, since the input terminal and the output terminal of the buffer to be mounted on the semiconductor substrate are respectively connected to the metal layer and the semiconductor of the second conductivity type, the semiconductor apparatus can be provided, in which the capacitor can be protected from being affected by the junction capacitance between the semiconductor layers of different conductivity types.

We claim:

1. A semiconductor apparatus comprising a semiconductor region of first conductivity type formed on a semiconductor substrate and a semiconductor region of second conductivity type formed in said semiconductor region of first conductivity type, characterized by a semiconductor capacitance having a first electrode formed on said semiconductor region of second conductivity type to form a capacitance through a dielectric layer, a second electrode connected to said semiconductor region of first conductivity type and a third electrode connected to said semiconductor region of second conductivity type, and a buffer circuit, in which at least one of said first and third electrodes is connected to an input terminal of said buffer circuit, and said second electrode is connected to an output terminal of said buffer circuit, whereby a parasitic capacitor from said second electrode to ground is substantially short-circuited by said buffer circuit.

2. A semiconductor apparatus according to claim 1, in which a semiconductor region of first conductivity type is further formed on said semiconductor region of second conductivity type, and said semiconductor region of said first conductivity type and said semiconductor region of second conductivity type are electrically connected.

3. A semiconductor apparatus comprising a semiconductor region of second conductivity type formed on a semiconductor substrate consisting of a semiconductor material of first conductivity type, and a semiconductor region of first conductivity type formed on said semiconductor region of second conductivity type, characterized by a semiconductor capacitance having a first electrode formed on said semiconductor region of first conductivity type. a second electrode connected to said semiconductor region of first conductivity type and a third electrode connected to said semiconductor region of second conductivity type. and a buffer circuit, wherein at least one of said first and second electrodes is connected to an input terminal of said buffer circuit and said third electrode is connected to an output terminal of said buffer circuit. whereby a parasitic capacitor from said second electrode to ground is substantially short-circuited by said buffer circuit.

4. A semiconductor apparatus according to claim 3. characterized in that a semiconductor region of second conductivity type is further formed in said semiconductor region of first conductivity type. and said semiconductor region of second conductivity type and said semiconductor region of first conductivity type are electrically connected.

* * * * *